United States Patent
Liu (10) Patent No.: US 12,362,217 B2
(45) Date of Patent: Jul. 15, 2025

(54) ELECTROSTATIC CHUCK AND SEMICONDUCTOR PROCESSING APPARATUS

(71) Applicant: BEIJING NAURA MICROELECTRONICS EQUIPMENT CO., LTD., Beijing (CN)

(72) Inventor: Jian Liu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 107 days.

(21) Appl. No.: 18/309,227

(22) Filed: Apr. 28, 2023

(65) Prior Publication Data

US 2023/0260817 A1  Aug. 17, 2023

Related U.S. Application Data

(63) Continuation of application No. PCT/CN2021/125979, filed on Oct. 25, 2021.

(30) Foreign Application Priority Data

Oct. 28, 2020 (CN) .......................... 202011170370.1

(51) Int. Cl.
*H01L 21/683* (2006.01)

(52) U.S. Cl.
CPC ............................... *H01L 21/6833* (2013.01)

(58) Field of Classification Search
CPC .................................................. H01L 21/6833
See application file for complete search history.

(56) References Cited

U.S. PATENT DOCUMENTS

| | | | |
|---|---|---|---|
| 6,267,839 B1* | 7/2001 | Shamouilian | B23Q 3/154 |
| | | | 118/728 |
| 11,532,497 B2* | 12/2022 | Cho | C23C 16/505 |
| 2015/0002983 A1 | 1/2015 | Lee et al. | |
| 2015/0294790 A1* | 10/2015 | Johnson | H01G 2/22 |
| | | | 361/328 |
| 2018/0130690 A1* | 5/2018 | Benjamin | H01L 21/6833 |

(Continued)

FOREIGN PATENT DOCUMENTS

| | | |
|---|---|---|
| CN | 101211752 A | 7/2008 |
| CN | 101677053 A | 3/2010 |
| CN | 104377105 A | 2/2015 |

(Continued)

*Primary Examiner* — Scott Bauer
(74) *Attorney, Agent, or Firm* — ANOVA LAW GROUP, PLLC (57) ABSTRACT

An electrostatic chuck arranged in a process chamber of a semiconductor processing apparatus includes an insulation layer for carrying a wafer and an electrode assembly arranged in the insulation layer. The electrode assembly is electrically connected to a direct current (DC) power supply and a radio frequency (RF) power supply. When the DC power supply applies DC power to the electrode assembly, the electrode assembly is used to adsorb the wafer on the insulation layer. When the RF power supply applies RF power to the electrode assembly, the RF power is uniformly distributed to different positions of the insulation layer.

20 Claims, 4 Drawing Sheets

(56) References Cited

U.S. PATENT DOCUMENTS

2018/0323042 A1\* 11/2018 Wang ................. H01L 21/6833
2019/0006225 A1\* 1/2019 Matyushkin ...... H01J 37/32568

FOREIGN PATENT DOCUMENTS

| CN | 111354672 A | 6/2020 |
| CN | 112331607 A | 2/2021 |
| JP | H0677309 A | 3/1994 |
| JP | 2000349141 A | 12/2000 |
| JP | 2020111803 A | 7/2020 |
| KR | 20020070668 A | 9/2002 |
| TW | I553773 B | 10/2016 |
| TW | 202015173 A | 4/2020 |

\* cited by examiner

ELECTROSTATIC CHUCK AND SEMICONDUCTOR PROCESSING APPARATUS

CROSS-REFERENCE TO RELATED APPLICATION

This application is claims priority to PCT Patent Application No. PCT/CN2021/125979, filed on Oct. 25, 2021, which claims the priority of Chinese Patent Application No. 202011170370.1, filed on Oct. 28, 2020, the entire contents of all of which are incorporated herein by reference.

TECHNICAL FIELD

The present disclosure relates to the technical field of semiconductor manufacturing technologies and, more particularly, to an electrostatic chuck and a semiconductor processing apparatus.

BACKGROUND

Currently, a lower electrode structure of a semiconductor processing apparatus often includes an electrostatic chuck (ESC), a radio frequency (RF) system, and a direct current (DC) power supply system. The electrostatic chuck includes a ceramic layer, a heating layer, and a base layer sequentially arranged from top to bottom. An adsorption electrode is configured inside the ceramic layer to adsorb a wafer. A heating wire is configured inside the heating layer to heat the wafer.

The adsorption electrode often includes two electrodes, that is, a DC cathode and a DC anode. Both electrodes are arranged inside the ceramic layer and are connected to the DC power supply system through electric cables. The DC power supply system provides a DC voltage across the DC cathode and the DC anode to adsorb the wafer. In addition, the radio frequency system is electrically connected to the base layer through electrical cables or copper pillars to feed radio frequency energy through the base layer. Different layers of the electrostatic chuck are often bonded together through an adhesive, and certain tolerances exist in processing the ceramic layer, the heating layer, and the base layer. In a process of bonding a multi-layer structure, the adhesive layer may have an inconsistent thickness at different positions. Correspondingly, the capacitance formed between the base layer and the wafer arranged on the ceramic layer varies at different positions. Thus, the wafer receives different amounts of radio frequency energy at different positions, thereby affecting consistency of processing results.

SUMMARY

One aspect of the present disclosure provides an electrostatic chuck arranged in a process chamber of a semiconductor processing apparatus. The electrostatic chuck includes an insulation layer for carrying a wafer and an electrode assembly arranged in the insulation layer. The electrode assembly is electrically connected to a direct current (DC) power supply and a radio frequency (RF) power supply. When the DC power supply applies DC power to the electrode assembly, the electrode assembly is used to adsorb the wafer on the insulation layer. When the RF power supply applies RF power to the electrode assembly, the RF power is uniformly distributed to different positions of the insulation layer.

Another aspect of the present disclosure provides a semiconductor processing apparatus. The semiconductor processing apparatus includes a process chamber, a direct current (DC) power supply, a radio frequency (RF) power supply, and an electrostatic chuck including an insulation layer for carrying a wafer and an electrode assembly arranged in the insulation layer. The electrode assembly is electrically connected to the DC power supply and the RF power supply. When the DC power supply applies DC power to the electrode assembly, the electrode assembly is used to adsorb the wafer on the insulation layer. When the RF power supply applies RF power to the electrode assembly, the RF power is uniformly distributed to different positions of the insulation layer.

The technical solution of embodiments of the present disclosure includes the following beneficial effects.

In embodiments of the present disclosure, the RF power supply and the DC power supply are electrically connected to the electrode assembly. When the DC power supply feeds the DC power to the electrode assembly, the electrode assembly is used to adsorb a workpiece to be processed on the insulation layer. When the RF power supply feeds the RF power to the electrode assembly, the RF power is uniformly distributed to different positions of the insulation layer. In this way, the adsorption and fixation of the wafer can be achieved, and the RF power provided by the RF power supply can be directly fed into the electrode assembly, and the RF power is ensured to uniformly reach different positions of the insulation layer. Thus, the inconsistency of the RF power distribution often occurred due to capacitance differences in the multi-layer structure of the electrostatic chuck can be avoided, the consistency of the wafer process results can be substantially improved, and the yield of wafers can be increased.

Additional aspects and advantages of the present disclosure are provided in the following description. These aspects and advantages become obvious from the following description or are known through the implementation of the present disclosure.

BRIEF DESCRIPTION OF THE DRAWINGS

To more clearly illustrate the technical solution of the present disclosure, the accompanying drawings used in the description of the disclosed embodiments are briefly described below. The drawings described below are merely some embodiments of the present disclosure. Other drawings may be derived from such drawings by a person with ordinary skill in the art without creative efforts and may be encompassed in the present disclosure.

DETAILED DESCRIPTION OF THE EMBODIMENTS

The present disclosure is described in detail below, and embodiments of the present disclosure are shown in the drawings. Same or similar reference numerals denote same or similar components or components having the same or similar functions throughout. In addition, detailed descriptions of known technologies will be omitted if they are not necessary to illustrate features of the present disclosure. The embodiments described below with reference to the drawings are merely exemplary for explaining the present disclosure, and should not be construed as limiting the present disclosure.

Those skilled in the art should understand that, unless otherwise defined, all terms (including technical terms and scientific terms) used herein have the same meanings as commonly understood by those of ordinary skill in the art to which the present disclosure belongs. It should also be understood that terms, such as those defined in commonly used dictionaries, should be understood to have meanings consistent with their meaning in the context of the prior art, and unless specifically defined as herein, are not intended to have idealized or overly formal meanings.

The technical solution of the present disclosure and how the technical solution of the present disclosure solves the above technical problems will be described in detail below with specific embodiments.

Figure 1:
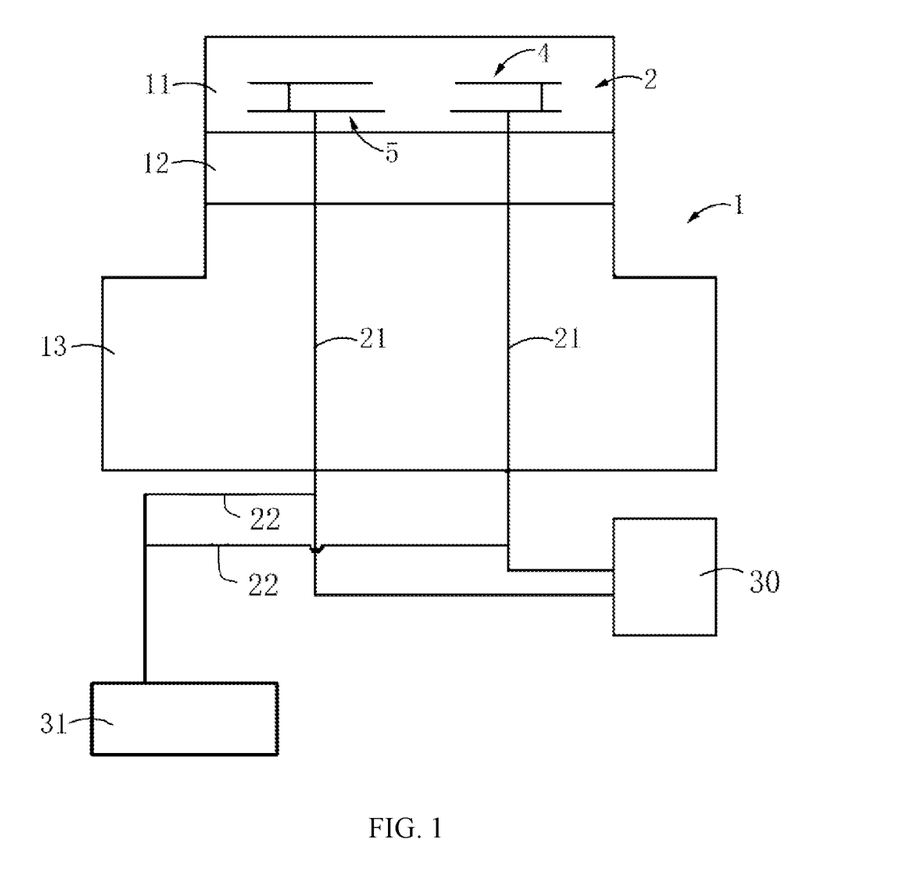
FIG. 1 is a schematic structural diagram of an exemplary electrostatic chuck according to some embodiments of the present disclosure.

The present disclosure provides an electrostatic chuck arranged in a process chamber of a semiconductor processing apparatus. FIG. 1 is a schematic structural diagram of an exemplary electrostatic chuck according to some embodiments of the present disclosure. As shown in FIG. 1, the electrostatic chuck 1 includes an insulation layer 11 for carrying a wafer (not shown in the figure) and an electrode assembly 2 arranged in the insulation layer 11. The electrode assembly 2 is electrically connected to a direct current (DC) power supply 30 and a radio frequency (RF) power supply 31 and is configured to adhere the wafer onto the insulation layer 11 when the DC power supply 30 feeds a DC power, and to uniformly distribute RF power to different positions of the insulation layer 11 when the RF power supply 31 feeds the RF power.

In some embodiments, as shown in FIG. 1, the electrostatic chuck 1 includes the insulation layer 11, a heating layer 12, and a base layer 13 sequentially arranged from top to bottom. The base layer 13 is used to be fixed in the process chamber (not shown) and to support the heating layer 12 and the insulation layer 11. The heating layer 12 is used to heat the insulation layer 11, to control the temperature of the wafer. The insulation layer 11 includes a supporting surface for carrying the wafer. In some embodiments, the insulation layer 11 may be made of a ceramic material, but embodiments of the present disclosure are not limited thereto.

The electrode assembly 2 is, for example, arranged in the insulation layer 11 at a certain distance below the supporting surface. In some embodiments, the electrode assembly 2 may be electrically connected to the DC power supply 30 through cables 21, and electrically connected to the RF power supply 31 through the cables 21 and cables 22. When the DC power supply 30 feeds the DC power to the electrode assembly 2 through the cables 21, the electrode assembly 2 and the wafer placed on the insulation layer 11 generate electrostatic attraction, thereby realizing the adsorption and fixing of the wafer. When the RF power is fed to the electrode assembly 2 through the cables 22 and the cables 21, an RF bias voltage may be generated on the wafer placed on the insulation layer 11. Moreover, when the RF power supply 31 feeds the RF power, the electrode assembly 2 may uniformly distribute the RF power to different positions of the insulation layer 11. Because the RF power provided by the RF power supply 31 is directly fed into the electrode assembly 2, and the RF power is uniformly distributed to different positions of the insulation layer 11, the RF power fluctuation due to differences of capacitance formed between multilayer structures of the electrostatic chuck can be avoided. Thus, consistency of wafer process results can be substantially improved, thereby improving yield of wafers.

In some embodiments, the electrode assembly 2 includes an adsorption electrode 4 and a distribution electrode 5. The adsorption electrode 4 is electrically connected to the DC power supply 30 and the RF power supply 31 through the distribution electrode 5. The distribution electrode 5 is used to feed the DC power provided by the DC power supply 30 and the RF power provided by the RF power supply 31 to the adsorption electrode 4. Moreover, an electrical connection point between the adsorption electrode 4 and the distribution electrode 5 has a same distance to various positions on an edge of the adsorption electrode 4. In some embodiments, the adsorption electrode 4 is provided with an RF feed-in point (that is, the above electrical connection point), which is used for providing an electrical connection to the distribution electrode 5. A position of the RF feeding point on the adsorption electrode 4 satisfies the following condition. Distances from an RF feed-in point to different positions on the edge of the adsorption electrode 4 are the same, such that consistency of various RF signal paths in the adsorption electrode 4 can be ensured, and same RF power is ensured to reach different positions of the insulation layer 11.

Figure 2:
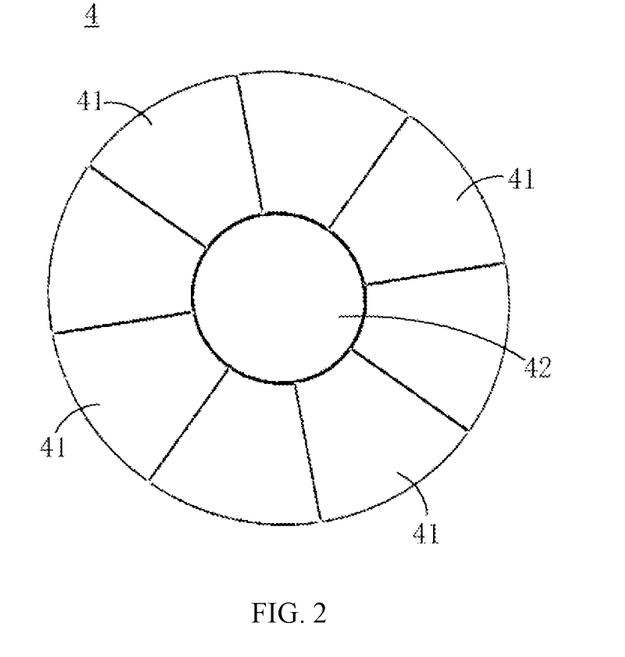
FIG. 2 is a schematic structural diagram of an exemplary adsorption electrode according to some embodiments of the present disclosure.
Figure 3:
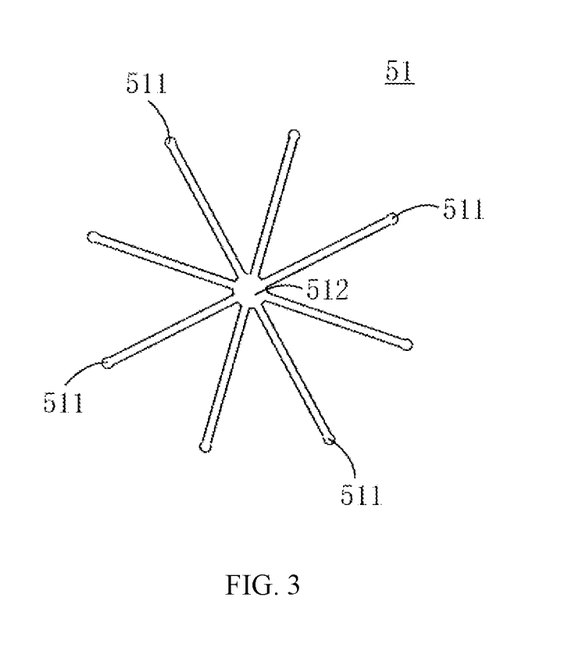
FIG. 3 is a schematic structural diagram of an exemplary first distribution electrode according to some embodiments of the present disclosure.
Figure 4:
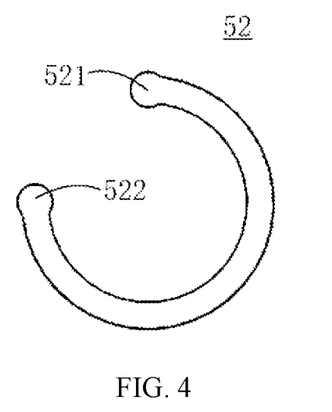
FIG. 4 is a schematic structural diagram of an exemplary second distribution electrode according to some embodiments of the present disclosure.

In some embodiments, as shown in FIGS. 2 to 4, the adsorption electrode 4 includes a plurality of first electrodes 41 and a second electrode 42 surrounded by the plurality of first electrodes 41 arranged at intervals, and the distribution electrode 5 includes a first distribution electrode 51 and a second distribution electrode 52. The first distribution electrode 51 is electrically connected to the plurality of first electrodes 41 respectively, and the second distribution electrode 52 is electrically connected to the second electrode 42. The first distribution electrode 51 and the second distribution electrode 52 are connected to a positive electrode and a negative electrode of the DC power supply 30, respectively, and both the first distribution electrode 51 and the second distribution electrode 52 are electrically connected to the RF power supply 31. In this case, distances from connection points electrically connecting between the plurality of first electrodes 41 and the first distribution electrode 51 to different positions on edges of the plurality of respective first electrodes 41 are the same to ensure the consistency of the RF signal paths in the plurality of first electrodes 41, and distances between a connection point electrically connecting between the second electrode 42 and the second distribution electrode 52 to different positions on an edge of the second electrode 42 are the same to ensure the consistency of the RF signal paths in the second electrode 42. The distance between a connection point electrically connecting between the first distribution electrode 51 and the RF power supply 31 and a connection point electrically connecting between the first distribution electrode 51 and each of the plurality of corresponding first electrodes 41 is a first distance, and the distance between a connection point electrically connecting between the second distribution electrode 52 and the RF power supply 31 and a connection point electrically connecting between the second distribution electrode 52 and each of the plurality of corresponding first electrodes 41 is a second distance. The first distance and the second distance are the same to ensure the consistency of the RF signal paths between the plurality of respective first electrodes 41 and the second electrode 42.

The first distribution electrode 51 is electrically connected to the positive electrode of the DC power supply 30, while the second distribution electrode 52 is electrically connected to the negative electrode of the DC power supply 30. Alternatively, the first distribution electrode 51 is electrically connected to the negative electrode of the DC power supply 30, and the second distribution electrode 52 is electrically connected to the positive electrode of the DC power supply 30.

By means of the first distribution electrode 51 and the second distribution electrode 52, the plurality of first electrodes 41 and the second electrode 42 are electrically connected to the DC power supply 30, and at the same time, the RF power provided by the RF power supply 31 can be supplied to the plurality of first electrodes 41 and the second electrode 42. Thus, the resulting structure is relatively simple and easy to implement, and electromagnetic interference between the plurality of first electrodes 41 and the second electrode 42 can be avoided.

Figure 5:
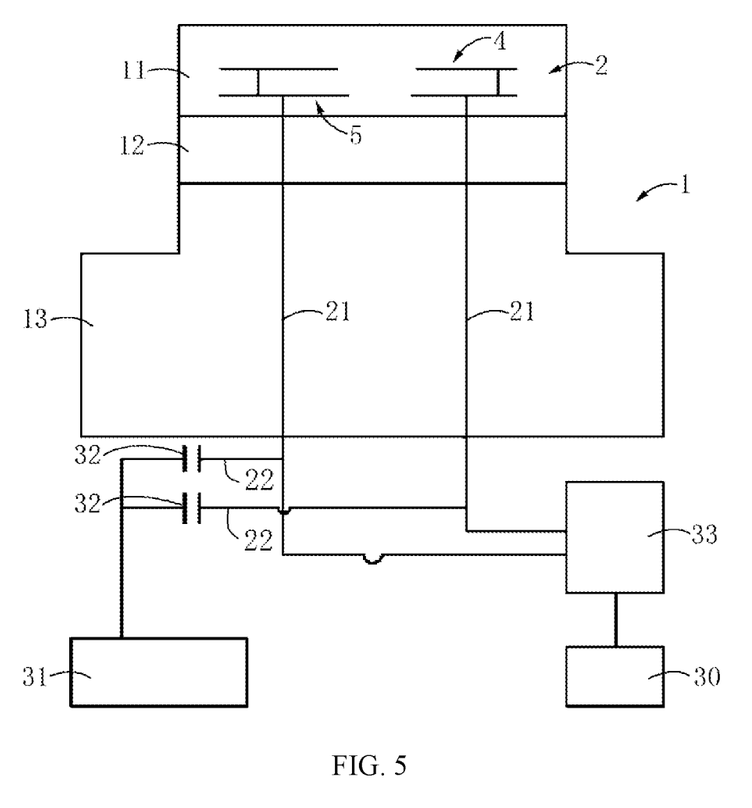
FIG. 5 is a schematic structural diagram of another exemplary electrostatic chuck according to some embodiments of the present disclosure.

FIG. 5 is a schematic structural diagram of another exemplary electrostatic chuck according to some embodiments of the present disclosure. As shown in FIG. 5, the electrostatic chuck 1 is an improvement made on the basis of the electrostatic chuck 1 shown in FIG. 1. In some embodiments, to prevent the RF power supply 31 from affecting operation of the DC power supply 30, the electrostatic chuck 1 also includes a filter 33 and an anti-short circuit. The first distribution electrode 51 and the second distribution electrode 52 are electrically connected to the positive electrode and the negative electrode of the DC power supply 30, respectively, through the filter 33, and the first distribution electrode 51 and the second distribution electrode 52 both are electrically connected to the RF power supply 31 through the anti-short circuit. The filter 33 is used for preventing the RF power supply 31 from affecting the operation of the DC power supply 30, thereby avoiding any adverse effect on the electrode assembly 2. The filter 33 may be arranged near the DC power supply 30. The anti-short circuit is used for avoiding a short circuit between the positive electrode and the negative electrode of the DC power supply 30.

In some embodiments, the anti-short circuit includes two branches (i.e., cables 22) and a capacitor 32 arranged at each branch (i.e., cable 22). The two branches (i.e., one end of each cable 22) are respectively connected to two circuits (namely, two cables 21) in which the first distribution electrode 51 and the second distribution electrode 52 are electrically connected to the positive electrode and the negative electrode of the DC power supply 30, respectively. The two branches (i.e., the other end of each cable 22) are also electrically connected to the RF power supply 31. Because the capacitors 32 have characteristics of blocking DC signals and passing AC signals, the capacitors 32 need to be able to withstand an adsorption voltage of the DC power supply 30 and an RF voltage and an RF current of the RF power supply 31. During operation, the adsorption voltage is about ±2000V, and the RF current is about 1 A to 2 A. Thus, the capacitors 32 need to withstand a DC voltage of 2000V or more and an RF current of 2 A or more. Embodiments of the present disclosure are not limited thereto.

Specific structures of the plurality of first electrodes 41, the second electrode 42, the first distribution electrode 51, and the second distribution electrode 52 will be described in detail below. In some embodiments, as shown in FIG. 2, the plurality of first electrodes 41 has a same shape, and the plurality of first electrodes 41 is located on a same plane and spaced from each other. The first distribution electrode 51 is electrically connected to the plurality of first electrodes 41, and the connection points of different first electrodes 41 electrically connected to the first distribution electrode 51 are located at a same position on each of the plurality of first electrodes 41. In some embodiments, each of the plurality of first electrodes 41 is provided with an RF feed-in point (that is, the above connection point), and the RF feed-in point is used to electrically connect to the first distribution electrode 51, and the RF feed-in points on different first electrodes 41 are located at a same position on each of the plurality of first electrodes 41 to ensure the consistency of the RF signal paths on different first electrodes 41.

In some embodiments, the plurality of first electrodes 41 is arranged to surround the second electrode 42, and each of the orthogonal projection areas of the plurality of first electrodes 41 on the supporting surface of the insulation layer 11 is the same as an orthogonal projection area of the second electrode 42 on the supporting surface of the insulation layer 11. In this way, the consistency of the RF signal paths between each of the plurality of first electrodes 41 and the second electrode 42 can be ensured. For example, as shown in FIG. 2, the second electrode 42 has a disc shape, and the plurality of first electrodes 41 forms a ring around the second electrode 42. A center of the second electrode 42 coincides with a center of the ring formed by the plurality of first electrodes 41.

In some embodiments, as shown in FIG. 2, the adsorption electrode 4 includes the second electrode 42 in a disk shape and eight first electrodes 41 arranged in a ring shape surrounding the second electrode 42. Each of the orthogonal projection areas of the plurality of first electrodes 41 on the supporting surface of the insulation layer 11 is the same as the orthogonal projection area of the second electrode 42 on the supporting surface of the insulation layer 11. The center of the second electrode 42 coincides with the center of the ring shape formed by the eight first electrodes 41. That is, the second electrode 42 is arranged concentrically with the ring shape formed by the eight first electrodes 41. By adopting the above design, the structure of the embodiment of the present disclosure is simple and easy to manufacture, thereby greatly reducing processing and manufacturing cost thereof.

In practical applications, the DC power supply 30 may be used to supply a negative voltage to the plurality of first electrodes 41 and a positive voltage to the second electrode 42, such that not only any impact by the DC voltage on a plasma in a process chamber can be avoided, but also any damage of the wafer caused by adhesion between the electrostatic chuck 1 and the wafer can be avoided, thereby greatly improving the uniformity and yield of process results.

In some embodiments, the plurality of first electrodes 41 is electrically isolated and is physically separated by a first gap between any two adjacent first electrodes 41. The first gap may be set to about 0.1 mm to 1 mm. The plurality of first electrodes 41 and the second electrode 42 are also electrically isolated, and are physically separated by a second gap between the plurality of first electrodes 41 and the second electrode 42. The second gap needs to withstand the voltage between the positive electrode and the negative electrode of the DC power supply 30. The second gap may be set to about 0.1 mm to 3 mm.

Embodiments of the present disclosure do not limit the shape, quantity, and arrangement of the plurality of first electrodes 41 and the second electrode 42. Embodiments of the present disclosure are not limited thereto, and those skilled in the art may adjust configurations according to actual conditions.

As shown in FIG. 1 and FIG. 2, the plurality of first electrodes 41 is arranged on a same layer, that is, the plurality of first electrodes 41 is arranged on a same horizontal plane in the insulation layer 11. The plurality of first electrodes 41 may be an electrode sheet formed in the insulation layer 11. For example, the plurality of first electrodes 41 may be made of tungsten or platinum, but embodiments of the present disclosure are not limited thereto. The first distribution electrode 51 is also arranged in the insulation layer 11 and is located below the plurality of first electrodes 41. The first distribution electrode 51 is electrically connected to the plurality of first electrodes 41, and is used for uniformly distributing the RF power provided by the RF power supply 31 to the plurality of first electrodes 41. By designing the plurality of first electrodes 41, the distance from the RF feed-in point on each first electrode 41 to the edge can be reduced, such that the implementation of the present disclosure is not only applicable to low-frequency RF signals, but also applicable to high-frequency RF signals.

In some embodiments, a currently adopted RF signal is often a continuous sine wave signal. The wavelength of the RF signal is λ=c/f, where c is the speed of light and takes a certain value, and f is the frequency of the RF signal. The frequency of the low-frequency RF signal is often 2 KHz or 13.56 MHz. For example, a wavelength of the commonly used low-frequency RF signal of 13.56 MHz is 22 meters. The frequency of the high-frequency radio frequency signal is often about 50 MHz to 100 MHz, and the RF period is often about 10 ns to 20 ns. When the RF period is 10 ns, the frequency is 100 MHz, and the wavelength is 3 m.

The lower the frequency of the RF signal, the longer the wavelength is. Conversely, the higher the frequency of the radio frequency signal, the shorter the wavelength is. Moreover, the greater the distance from the RF feed-in point on an electrode to the edge of the electrode, the easier it is for the waveform to diverge on the electrode, resulting in poor consistency of the waveform on the electrode, thereby affecting the process results. Generally, if the distance from the RF feed-in point on the electrode to the edge of the electrode is smaller than a diameter of the wafer (for example, 300 mm), waveforms on the plurality of first electrodes 41 are ensured not to spread substantially. In some embodiments, by designing the plurality of first electrodes 41, the distance from the RF feed-in point on each of the plurality of first electrodes 41 to the edge thereof may be reduced, making the distance far smaller than the diameter of the wafer. As a result, regardless of the low-frequency RF signal or the high-frequency RF signal, the waveforms are ensured not to substantially spread on each of the plurality of first electrodes 41, and the consistency of the waveforms on each of the plurality of first electrodes 41 is ensured. Thus, embodiments of the present disclosure are not only applicable to the low-frequency RF signals, but also applicable to the high-frequency RF signals.

In some embodiments, as shown in FIG. 3, the first distribution electrode 51 includes a central portion and a plurality of edge portions electrically connected to each other. The orthogonal projection of the center of the central portion on the supporting surface of the insulation layer 11 coincides with the orthogonal projection of the center of the second electrode 42 on the supporting surface of the insulation layer 11. The central portion has a first connection point 512 at the center, which is electrically connected to the RF power supply 31. The plurality of edge portions is distributed at intervals along a circumferential direction of the central portion. A number of the plurality of edge portions is the same as a number of the plurality of first electrodes 41. The plurality of edge portions is arranged in one-to-one correspondence with the plurality of first electrodes 41. Each of the plurality of edge portions has a second connection point 511. The second connection point 511 is electrically connected to a geometric center of the corresponding first electrode 41. The geometric center of each of the plurality of first electrodes 41 satisfies a condition that the distances from the geometric center of each of the plurality of first electrodes 41 to different positions on the edge of the first electrode 41 are the same. A connection portion is provided between each of the plurality of second connection points 511 and the geometric center of each corresponding first electrode 41 of the plurality of first electrodes 41 to provide electrical conduction between the second connection point 511 and the first electrode 41. The connection portion is, for example, a vertical connection line to shorten a connection distance.

For example, the first distribution electrode 51 is provided with an RF feed-in point (i.e., the first connection point 512) used for providing the electrical connection to the RF power supply 31. The first distribution electrode 51 is also provided with a plurality of RF feed-out points (i.e., the plurality of second connection points 511), each of which is electrically connected to the geometric center of each of the plurality of first electrodes 41. Thus, the RF power can be uniformly distributed to the plurality of first electrodes 41.

In some embodiments, as shown in FIG. 3, each of the plurality of edge portions is strip-shaped and arranged along a radial direction of the central portion. One end of each of the plurality of edge portions is connected to the central portion and is electrically conducted, and the other end of each of the plurality of edge portions has the second connection point 511. That is, the plurality of strip-shaped edge portions is radially distributed from the central portion to the surroundings. With this design, by centering the center portion relative to an axis of the insulation layer 11, the plurality of strip-shaped edge portions may be distributed radially around the axis of the insulation layer 11, such that the first distribution electrode 51 provides consistent distribution on the insulation layer 11 as desired. Embodiments of the present disclosure do not limit the specific structure of the first distribution electrode 51, and those skilled in the art may adjust the configuration according to the actual situation.

As shown in FIG. 4, the second distribution electrode 52 has a third connection point 521 and a fourth connection point 522. The third connection point 521 is electrically connected to the geometric center of the second electrode 42. The geometric center of the second electrode 42 satisfies a condition that the distances from the geometric center of the second electrode 42 to different positions on the edge of the second electrode 42 are the same. For example, if the second electrode 42 is disc-shaped, the geometric center of the second electrode 42 is a center of the disc. The connection portion is provided between each of the plurality of third connection points 521 and the geometric center of each corresponding second electrode 42 of the plurality of second electrodes 42 to provide the electrical conduction between the two. The connection portion is, for example, the vertical connection line to shorten the connection distance.

For example, the second distribution electrode 52 is provided with an RF feed-in point (i.e., the fourth connection point 522) used for providing the electrical connection to the RF power supply 31. The second distribution electrode 52 is also provided with an RF feed-out point (i.e., the third connection point 521). The RF feed-out point is electrically connected to the geometric center of the second electrode 42. Thus, the RF power can be uniformly distributed to the second electrode 42.

Moreover, the distance from the first connection point 512 on the first distribution electrode 51 to each of the plurality of second connection points 511 is the first distance, and the distance from the fourth connection point 522 to the third connection point 521 is the second distance. The first distance is equal to the second distance, such that a path length of the RF signal from an RF feed-in point of the first distribution electrode 51 to an RF feed-out point is consistent with a path length of the RF signal from an RF feed-in point of the second distribution electrode 52 to an RF feed-out point, such that the consistency of the RF signal path between the each of the plurality of first electrodes 41 and the second electrode 42 can be ensured. Both the first distance and the second distance refer to the path length of the RF signal from the RF feed-in point to the RF feed-out point.

By adopting the above design, the first distribution electrode 51 and the second distribution electrode 52 are able to distribute the RF signal to the plurality of first electrodes 41 and the second electrode 42, making the structure of embodiments of the present disclosure simple and easy to implement. Moreover, because the first distribution electrode 51 and the second distribution electrode 52 are designed independently of each other, the structure of embodiments of the present disclosure is further made simple and easy to use, thereby greatly reducing design and manufacturing costs.

In some embodiments, as shown in FIG. 4, the second distribution electrode 52 is arc-shaped, and the third connection point 521 and the fourth connection point 522 are located at two ends of the second distribution electrode 52, respectively. A length of the arc between the third connection point 521 and the fourth connection point 522 is the second distance. Embodiments of the present disclosure do not limit the specific structure of the second distribution electrode 52, for example, the second distribution electrode 52 may also adopt other curved shapes. Thus, embodiments of the present disclosure are not limited thereto, and those skilled in the art may adjust the configuration by themselves according to the actual situation.

Figure 6:
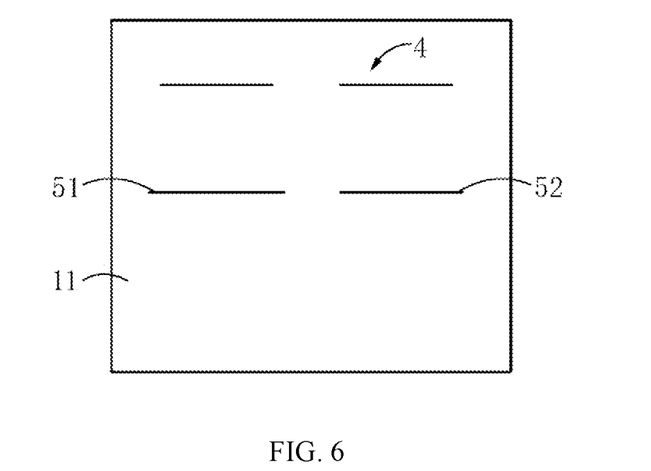
FIG. 6 is a schematic diagram of an exemplary layout of distribution electrodes according to some embodiments of the present disclosure.
Figure 7:
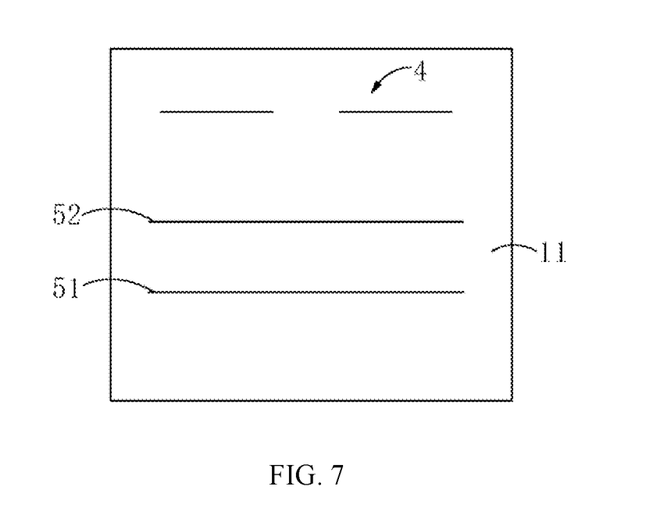
FIG. 7 is a schematic diagram of another exemplary layout of the distribution electrodes according to some embodiments of the present disclosure.

In some embodiments, as shown in FIG. 6 and FIG. 7, the first distribution electrode 51 and the second distribution electrode 52 are arranged in the same layer or in different layers. For example, as shown in FIG. 6, the first distribution electrode 51 and the second distribution electrode 52 are arranged in the same layer, that is, both are located in a same horizontal plane in the insulation layer 11, and are located below the adsorption electrode 4. The first distribution electrode 51 and the second distribution electrode 52 are arranged at intervals and are separated by a gap of about 0.1 mm to 3 mm to ensure a voltage withstanding requirement. By adopting the above design, a thickness of the insulation layer 11 can be greatly reduced, thereby reducing the occupied space of the insulation layer 11 to suit for the scenario where the thickness of the insulation layer 11 is limited.

When the first distribution electrode 51 and the second distribution electrode 52 are arranged in the same layer, the first connection point 512 on the first distribution electrode 51 may be located, for example, directly below the geometric center of the second electrode 42 to ensure each of the plurality of second connection points 511 on the first distribution electrode 51 corresponds to the geometric center of each of the plurality of first electrodes 41 respectively. In this case, the third connection point 521 on the second distribution electrode 52 may be adaptively arranged at a position slightly deviated from directly below the geometric center of the second electrode 42. Because the deviation is small, it may not affect the uniformity of the RF feeding, and position interference between the first distribution electrode 51 and the second distribution electrode 52 can be avoided.

As shown in FIG. 7, the first distribution electrode 51 and the second distribution electrode 52 are also arranged in different layers, that is, they are respectively located on two horizontal planes with different heights in the insulation layer 11, and both are located below the adsorption electrode 4. Because a height difference between the first distribution electrode 51 and the second distribution electrode 52 is relatively small, the uniformity of RF feeding may not be affected even if they are arranged in different layers.

Moreover, when the first distribution electrode 51 and the second distribution electrode 52 are arranged in different layers, the second distribution electrode 52 may be made higher than the first distribution electrode 51, such that the first connection point 512 on the first distribution electrode 51 can be located, for example, directly below the geometric center of the second electrode 42 to ensure that each of the plurality of second connection points 511 on the first distribution electrode 51 corresponds to the geometric center of each of the plurality of first electrodes 41. Meanwhile, the third connection point 521 on the second distribution electrode 52 may also be located directly below the geometric center of the second electrode 42 without interfering with the position of the first distribution electrode 51, such that the uniformity of RF feeding by the first distribution electrode 51 and the second distribution electrode 52 can be ensured.

Based on the same inventive concept, the present disclosure provides a semiconductor processing apparatus. The semiconductor processing apparatus includes a process chamber, a DC power supply, an RF power supply, and an electrostatic chuck as provided in the above embodiments. The electrostatic chuck is arranged inside the process chamber. The DC power supply and the RF power supply are electrically connected to the electrostatic chuck.

Embodiments of the present disclosure provide at least the following beneficial effects. The RF power supply and the DC power supply are electrically connected to the electrode assembly. When the DC power supply feeds the DC power to the electrode assembly, the electrode assembly is used to adsorb a workpiece to be processed (e.g., the wafer) on the insulation layer. When the RF power supply feeds the RF power to the electrode assembly, the RF power is uniformly distributed to different positions of the insulation layer. In this way, the adsorption and fixation of the wafer can be achieved, and the RF power provided by the RF power supply can be directly fed into the electrode assembly, and the RF power is ensured to uniformly reach different positions of the insulation layer. Thus, the inconsistency of the RF power distribution often occurred due to capacitance differences in the multi-layer structure of the electrostatic chuck can be avoided, the consistency of the wafer process results can be substantially improved, and the yield of wafers can be increased.

The above embodiments are merely exemplary for illustrating the operation principle of the present disclosure, but the present disclosure is not limited thereto. For those skilled in the art, various modifications and improvements may be made without departing from the spirit of the present disclosure, and these modifications and improvements are also regarded as the protection scope of the present disclosure.

In the description of the present disclosure, it should be understood that the orientations and positional relationships indicated by the terms "center", "upper", "lower", "front", "rear", "left", "right", "vertical", "horizontal", "top", "bottom", "inner", "outer", etc. are based on the orientations or positional relationships shown in the drawings, and are merely for the convenience of describing the present disclosure and simplifying the description, rather than indicating or implying that the referenced devices or elements must have a particular orientation, or must be constructed and operated in a particular orientation. Thus, they should not be construed as limiting the present disclosure.

The terms "first" and "second" are used for descriptive purposes only, and should not be understood as indicating or implying relative importance or implicitly specifying the quantity of indicated technical features. Thus, a feature defined as "first" and "second" may explicitly or implicitly include one or more of these features. In the description of the present disclosure, unless otherwise specified, "plurality" means two or more.

In the description of the present disclosure, it should be noted that unless otherwise specified and limited, the terms "installation", "attaching", and "connection" should be understood in a broad sense. For example, it may be a fixed connection, a detachable connection, or an integrally connected connection. It may be directly connected, or indirectly connected through an intermediary. It may be the internal connection of two elements. Those of ordinary skill in the art should understand the specific meanings of the above terms in the present disclosure in specific situations.

In the description of the specification, specific features, structures, materials or characteristics may be combined in any one or more embodiments or examples in an appropriate manner.

The above descriptions are only some implementations of the present disclosure. It should be pointed out that for those of ordinary skill in the art, improvements and modifications can be made without departing from the spirit of the present disclosure. These improvements and modifications should be regarded as within the protection scope of the present disclosure.

What is claimed is:

1. An electrostatic chuck arranged in a process chamber of a semiconductor processing apparatus, comprising:
   an insulation layer for carrying a wafer; and
   an electrode assembly arranged in the insulation layer, including:
      an adsorption electrode including a first electrode and a second electrode arranged at intervals; and
      a distribution electrode including a first distribution electrode electrically connected to the first electrode and a second distribution electrode electrically connected to the second electrode;
   wherein:
      the electrode assembly is electrically connected to a direct current (DC) power supply and a radio frequency (RF) power supply;
      in response to the DC power supply applying DC power to the electrode assembly, the electrode assembly is used to adsorb the wafer on the insulation layer; and
      in response to the RF power supply applying RF power to the electrode assembly, the RF power is uniformly distributed to different positions of the insulation layer.

2. The electrostatic chuck according to claim 1, wherein:
the electrostatic chuck includes an adsorption electrode and a distribution electrode, and the adsorption electrode is electrically connected to the DC power supply and the RF power supply through the distribution electrode; and
distances from a connection point electrically connecting the second electrode with the second distribution electrode to different positions on an edge of the second electrode are the same.

3. The electrostatic chuck according to claim 2, wherein:
the first distribution electrode and the second distribution electrode are electrically connected to a positive electrode and a negative electrode of the DC power supply, respectively, and both the first distribution electrode and the second distribution electrode are electrically connected to the RF power supply;
distances from a connection point electrically connecting the first electrode with the first distribution electrode to different positions on an edge of the first electrode are the same;
distances from a connection point electrically connecting the second electrode with the second distribution electrode to different positions on an edge of the second electrode are the same; and
a distance between a connection point electrically connecting the first distribution electrode with the RF power supply and a connection point electrically connecting the first distribution electrode with the first electrode is a first distance, and a distance between a connection point electrically connecting the second distribution electrode with the RF power supply and a connection point electrically connecting the second distribution electrode and the second electrode is a second distance, and the first distance and the second distance are the same.

4. The electrostatic chuck according to claim 3, wherein:
a plurality of first electrodes is included and has a same shape;
the plurality of first electrodes is located in a same plane, and is spaced apart from each other;
the first distribution electrode is electrically connected to the plurality of first electrodes; and
connection points of different first electrodes electrically connected to the first distribution electrode are located at a same position on each of the plurality of first electrodes.

5. The electrostatic chuck according to claim 4, wherein:
the plurality of first electrodes is arranged to surround the second electrode; and
an orthogonal projection area of each of the plurality of first electrodes on a supporting surface of the insulation layer is the same as an orthogonal projection area of the second electrode on the supporting surface of the insulation layer.

6. The electrostatic chuck according to claim 5, wherein:
the second electrode is disc-shaped;
the plurality of first electrodes is arranged to surround the second electrode to form a ring shape; and
a center of the second electrode coincides with a center of the ring shape formed by the plurality of first electrodes.

7. The electrostatic chuck according to claim 5, wherein:
the first distribution electrode includes a central portion having a first connection point at a center of the central portion and electrically connected to the RF power supply and a plurality of edge portions electrically connected to each other, and an orthogonal projection of the center of the central portion on the supporting surface of the insulation layer coincides with an orthogonal projection of a center of the second electrode on the supporting surface of the insulation layer;
the plurality of edge portions is distributed at intervals along a circumferential direction of the central portion, a number of the plurality of edge portions is the same as a number of the plurality of first electrodes, and the plurality of edge portions is arranged in one-to-one correspondence with the plurality of first electrodes;
each of the plurality of edge portions has a second connection point electrically connected to a geometric center of the corresponding first electrode, and the geometric center of each of the plurality of first electrodes satisfies a condition that the distances from the geometric center of each of the plurality of first electrodes to different positions on the edge of the first electrode are the same;
the second distribution electrode has a third connection point electrically connected to a geometric center of the second electrode and a fourth connection point electrically connected to the RF power supply;
the geometric center of the second electrode satisfies a condition that the distances from the geometric center of the second electrode to different positions on the edge of the second electrode are the same; and
a distance from the first connection point on the first distribution electrode to each of a plurality of second connection points is the first distance, and a distance from the fourth connection point to the third connection point is the second distance.

8. The electrostatic chuck according to claim 7, wherein:
each of the plurality of edge portions is strip-shaped and arranged along a radial direction of the central portion, one end of each of the plurality of edge portions is connected to the central portion and is electrically conducted, and the other end of each of the plurality of edge portions has the second connection point.

9. The electrostatic chuck according to claim 7, wherein:
the second distribution electrode is arc-shaped, and the third connection point and the fourth connection point are located at two ends of the second distribution electrode, respectively.

10. The electrostatic chuck according to claim 3, wherein:
the electrostatic chuck also includes a filter and an anti-short circuit, the first distribution electrode and the second distribution electrode are electrically connected to the positive electrode and the negative electrode of the DC power supply, respectively, through the filter, and the first distribution electrode and the second distribution electrode both are electrically connected to the RF power supply through the anti-short circuit;
the filter is used for preventing the RF power supply from affecting operation of the DC power supply; and
the anti-short circuit is used for avoiding a short circuit between the positive electrode and the negative electrode of the DC power supply.

11. The electrostatic chuck according to claim 10, wherein:
the anti-short circuit includes two branches and a capacitor arranged on each of the two branches, one ends of the two branches are electrically connected to the positive electrode and the negative electrode of the DC power supply, respectively, through the first distribution electrode and the second distribution electrode, and other ends of the two branches both are electrically connected to the RF power supply.

12. A semiconductor processing apparatus, comprising:
a process chamber;
a direct current (DC) power supply;
a radio frequency (RF) power supply; and
an electrostatic chuck including an insulation layer for carrying a wafer and an electrode assembly arranged in the insulation layer, the electrode assembly including, including:
an adsorption electrode including a first electrode and a second electrode arranged at intervals; and
a distribution electrode including a first distribution electrode electrically connected to the first electrode and a second distribution electrode electrically connected to the second electrode;
wherein:
the electrode assembly is electrically connected to the DC power supply and the RF power supply;
in response to the DC power supply applying DC power to the electrode assembly, the electrode assembly is used to adsorb the wafer on the insulation layer; and
in response to the RF power supply applying RF power to the electrode assembly, the RF power is uniformly distributed to different positions of the insulation layer.

13. The semiconductor processing apparatus according to claim 12, wherein:
the electrostatic chuck includes an adsorption electrode and a distribution electrode, and the adsorption electrode is electrically connected to the DC power supply and the RF power supply through the distribution electrode; and
distances from a connection point electrically connecting the second electrode with the second distribution electrode to different positions on an edge of the second electrode are the same.

14. The semiconductor processing apparatus according to claim 13, wherein:
the first distribution electrode and the second distribution electrode are electrically connected to a positive electrode and a negative electrode of the DC power supply, respectively, and the first distribution electrode and the second distribution electrode are electrically connected to the RF power supply;
distances from a connection point electrically connecting the first electrode with the first distribution electrode to different positions on an edge of the first electrode are the same;
distances from a connection point electrically connecting the second electrode with the second distribution electrode to different positions on an edge of the second electrode are the same; and
a distance between a connection point electrically connecting the first distribution electrode with the RF power supply and a connection point electrically connecting the first distribution electrode with the first electrode is a first distance, and a distance between a connection point electrically connecting the second distribution electrode with the RF power supply and a connection point electrically connecting the second distribution electrode and the second electrode is a second distance, and the first distance and the second distance are the same.

15. The semiconductor processing apparatus according to claim 14, wherein:
a plurality of first electrodes is included and has a same shape;
the plurality of first electrodes is located in a same plane, and is spaced apart from each other;
the first distribution electrode is electrically connected to the plurality of first electrodes; and
connection points of different first electrodes electrically connected to the first distribution electrode are located at a same position on each of the plurality of first electrodes.

16. The semiconductor processing apparatus according to claim 15, wherein:
the plurality of first electrodes is arranged to surround the second electrode; and
an orthogonal projection area of each of the plurality of first electrodes on a supporting surface of the insulation layer is the same as an orthogonal projection area of the second electrode on the supporting surface of the insulation layer.

17. The semiconductor processing apparatus according to claim 16, wherein:
the second electrode is disc-shaped;
the plurality of first electrodes is arranged to surround the second electrode to form a ring shape; and
a center of the second electrode coincides with a center of the ring shape formed by the plurality of first electrodes.

18. The semiconductor processing apparatus according to claim 16, wherein:
the first distribution electrode includes a central portion having a first connection point at a center of the central portion electrically connected to the RF power supply and a plurality of edge portions electrically connected to each other, and an orthogonal projection of the center of the central portion on the supporting surface of the insulation layer coincides with an orthogonal projection of a center of the second electrode on the supporting surface of the insulation layer;
the plurality of edge portions is distributed at intervals along a circumferential direction of the central portion, a number of the plurality of edge portions is the same as a number of the plurality of first electrodes, and the plurality of edge portions is arranged in one-to-one correspondence with the plurality of first electrodes;
each of the plurality of edge portions has a second connection point electrically connected to a geometric center of the corresponding first electrode, and the geometric center of each of the plurality of first electrodes satisfies a condition that the distances from the geometric center of each of the plurality of first electrodes to different positions on the edge of the first electrode are the same;
the second distribution electrode has a third connection point electrically connected to a geometric center of the second electrode and a fourth connection point electrically connected to the RF power supply;
the geometric center of the second electrode satisfies a condition that the distances from the geometric center of the second electrode to different positions on the edge of the second electrode are the same; and
a distance from the first connection point on the first distribution electrode to each of a plurality of second connection points is the first distance, and a distance from the fourth connection point to the third connection point is the second distance.

19. The semiconductor processing apparatus according to claim 18, wherein:
each of the plurality of edge portions is strip-shaped and arranged along a radial direction of the central portion, one end of each of the plurality of edge portions is connected to the central portion and is electrically conducted, and the other end of each of the plurality of edge portions has the second connection point.

20. The semiconductor processing apparatus according to claim 18, wherein:
the second distribution electrode is arc-shaped, and the third connection point and the fourth connection point are located at two ends of the second distribution electrode, respectively.

* * * * *